US008933567B2

(12) United States Patent
Bang et al.

(10) Patent No.: US 8,933,567 B2
(45) Date of Patent: Jan. 13, 2015

(54) ELECTRICALLY BROKEN, BUT MECHANICALLY CONTINUOUS DIE SEAL FOR INTEGRATED CIRCUITS

(75) Inventors: David Bang, San Diego, CA (US); Thomas Andrew Myers, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 375 days.

(21) Appl. No.: 12/784,706

(22) Filed: May 21, 2010

(65) Prior Publication Data
US 2011/0284994 A1 Nov. 24, 2011

(51) Int. Cl.
*H01L 23/58* (2006.01)
(52) U.S. Cl.
USPC .......................................... 257/758; 438/140
(58) Field of Classification Search
USPC ........................... 257/620, 622, 758; 438/140
See application file for complete search history.

(56) References Cited

U.S. PATENT DOCUMENTS

| 5,831,330 | A | 11/1998 | Chang |
| 6,427,222 | B1 | 7/2002 | Shau |
| 6,492,716 | B1 | 12/2002 | Bothra et al. |
| 6,879,023 | B1 | 4/2005 | Gutierrez |
| 7,384,818 | B2 | 6/2008 | Kim et al. |
| 2006/0102980 | A1* | 5/2006 | Nakashiba .................. 257/508 |
| 2008/0251923 | A1 | 10/2008 | Wang et al. |

FOREIGN PATENT DOCUMENTS

WO WO2010039981 4/2010

OTHER PUBLICATIONS

International Search Report and Written Opinion—PCT/US2011/037216-ISA/EPO—Jul. 27, 2011 (082091W0).

* cited by examiner

*Primary Examiner* — Thomas L Dickey
(74) *Attorney, Agent, or Firm* — Michelle Gallardo; Nicholas J. Pauley; Jonathan T. Velasco (57) ABSTRACT

A semiconductor die has multiple discontinuous conductive segments arranged around a periphery of the semiconductor die, and an electrically insulating barrier within discontinuities between the conductive segments. The conductive segments and the barriers form a mechanically continuous seal ring around the semiconductor die.

21 Claims, 8 Drawing Sheets

ELECTRICALLY BROKEN, BUT MECHANICALLY CONTINUOUS DIE SEAL FOR INTEGRATED CIRCUITS

TECHNICAL FIELD

The present disclosure generally relates to semiconductor dies with seal rings and, more specifically, to seal rings that are mechanically continuous but electrically discontinuous.

BACKGROUND

Figure 1:
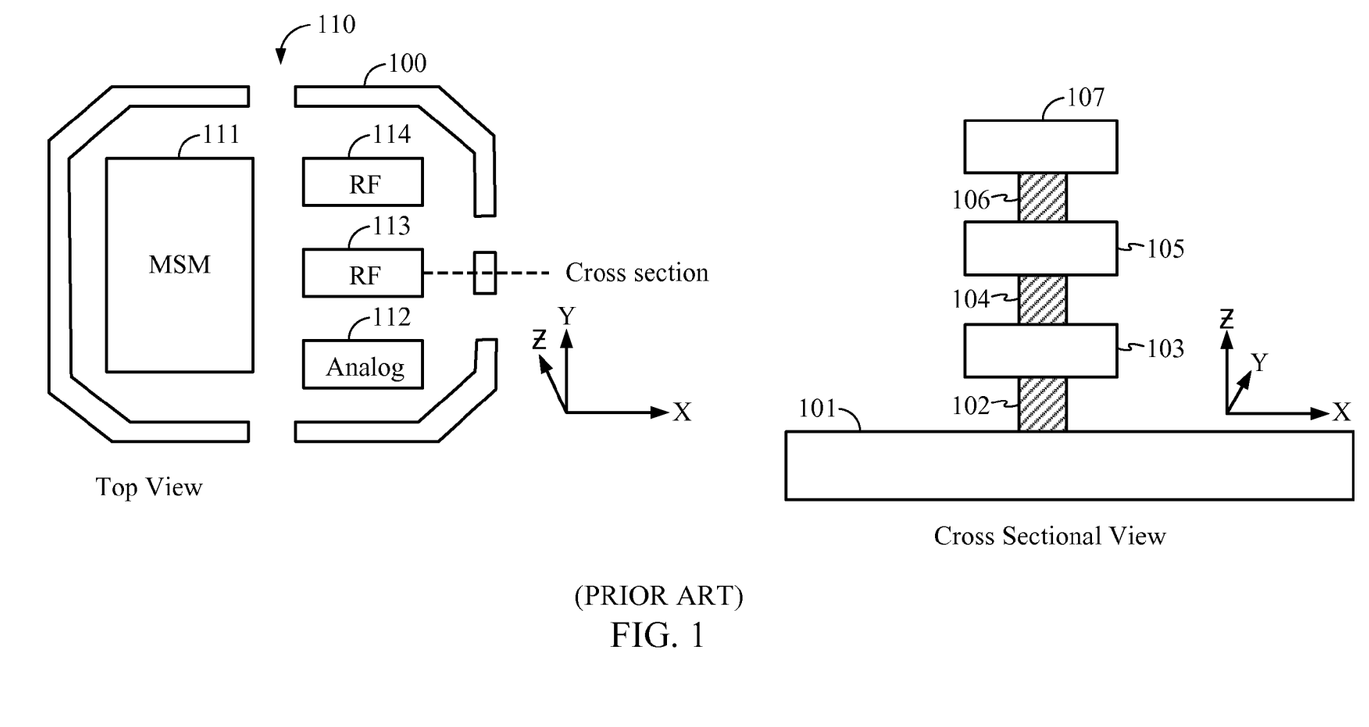
FIG. 1 is an illustration of a conventional seal ring for a semiconductor die, shown in both a top view and cross sectional view.

FIG. 1 is an illustration of a conventional seal ring 100 for a semiconductor die 110, shown in both a top-down view and cross sectional view. The seal ring 100 circumscribes the periphery of the semiconductor die 110 and helps to isolate the semiconductor die 110 from moisture and contamination and stops cracks caused during dicing. The seal ring 100 is built on a silicon substrate 101 and includes contact 102, vias 104 and 106, and metal segments 103, 105, and 107.

The semiconductor die 110 includes a variety of components, such as a digital logic circuit 111, an analog block 112, and Radio Frequency (RF) blocks 113, 114. Some conventional digital logic circuits, such as the circuit 111 are subject to sudden spikes in current that cause noise, whereas some conventional analog blocks and RF blocks (e.g., blocks 112-114) can be sensitive to noise.

Some conventional seal rings (not shown) are electrically continuous around the periphery of a die, and the direct electrical path around the periphery of the die can transfer five to ten decibels of noise to sensitive analog and RF blocks, which is undesirable. One conventional solution to prevent noise transfer is shown in the top-down view of FIG. 1. Specifically, the seal ring 110 is electrically discontinuous, thereby inhibiting a significant portion of the noise transfer. The solution shown in the top-down view of FIG. 1 can be effective to eliminate some of the noise, but the discontinuities of the seal ring 100 allow for penetration of the semiconductor die 110 by harmful moisture and other contaminants. Currently, there is no available solution that reduces the noise phenomenon described above while also preventing penetration of the semiconductor die 110 by moisture and contaminants.

BRIEF SUMMARY

A semiconductor die comprises a plurality of discontinuous conductive segments arranged around a periphery of the semiconductor die, and an electrically insulating barrier within discontinuities between the conductive segments. The conductive segments and the barriers form a mechanically continuous seal ring around the semiconductor die.

A method for fabricating a semiconductor die comprises fabricating a semiconductor die with a conductive seal ring around a periphery of the semiconductor die. The conductive seal ring has a plurality of discontinuities and a dielectric material within the discontinuities. The method further includes removing at least some of the dielectric material within the discontinuities to form gaps within the discontinuities and depositing an insulting material within the gaps to form a mechanically continuous seal ring around the periphery of the semiconductor die.

A semiconductor die comprises first means for sealing a periphery of the semiconductor die. The first sealing means is discontinuous and conductive. The semiconductor die further comprises second means for sealing the periphery of the semiconductor die. The second sealing means is insulative and located within discontinuities of the first sealing means. The first and second sealing means form a mechanically continuous seal ring around the semiconductor die.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 2:
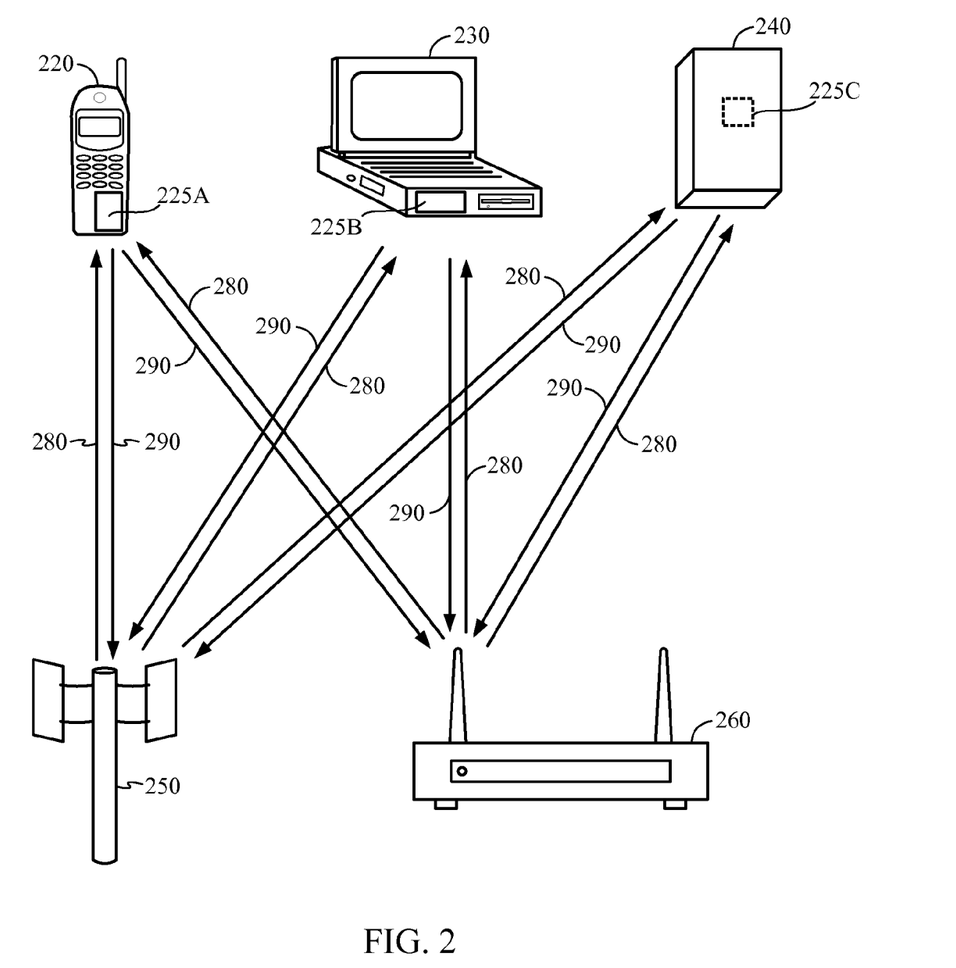
FIG. 2 shows an exemplary wireless communication system in which an embodiment of the disclosure may be advantageously employed.

FIG. 2 shows an exemplary wireless communication system 200 in which an embodiment of the disclosure may be advantageously employed. For purposes of illustration, FIG. 2 shows three remote units 220, 230, and 240 and two base stations 250, 260. It will be recognized that wireless communication systems may have many more remote units and base stations. The remote units 220, 230, and 240 include improved semiconductor chip packages 225A, 225B, and 225C, respectively, which use semiconductor dies with seal rings, according to the embodiments discussed in more detail below. While not shown in FIG. 2, it is understood that semiconductor dies with seal rings, according to the embodiments discussed below, can be included in base stations 250, 260 as well. FIG. 2 shows the forward link signals 280 from the base stations 250, 260 and the remote units 220, 230, and 240 and the reverse link signals 290 from the remote units 220, 230, and 240 to base stations 250, 260.

In FIG. 2, the remote unit 220 is shown as a mobile telephone, the remote unit 230 is shown as a portable computer, and the remote unit 240 is shown as a computer in a wireless local loop system. For example, the remote unit 220 may include mobile devices, such as cell phones, hand-held personal communication systems (PCS) units, portable data units such as personal data assistants. The remote unit 220 may also include fixed location data units such as meter reading equipment. Although FIG. 2 illustrates remote units according to the teachings of the disclosure, the disclosure is not limited to these exemplary illustrated units. The disclosure may be suitably employed in any device which includes a semiconductor chip package.

Figure 3:
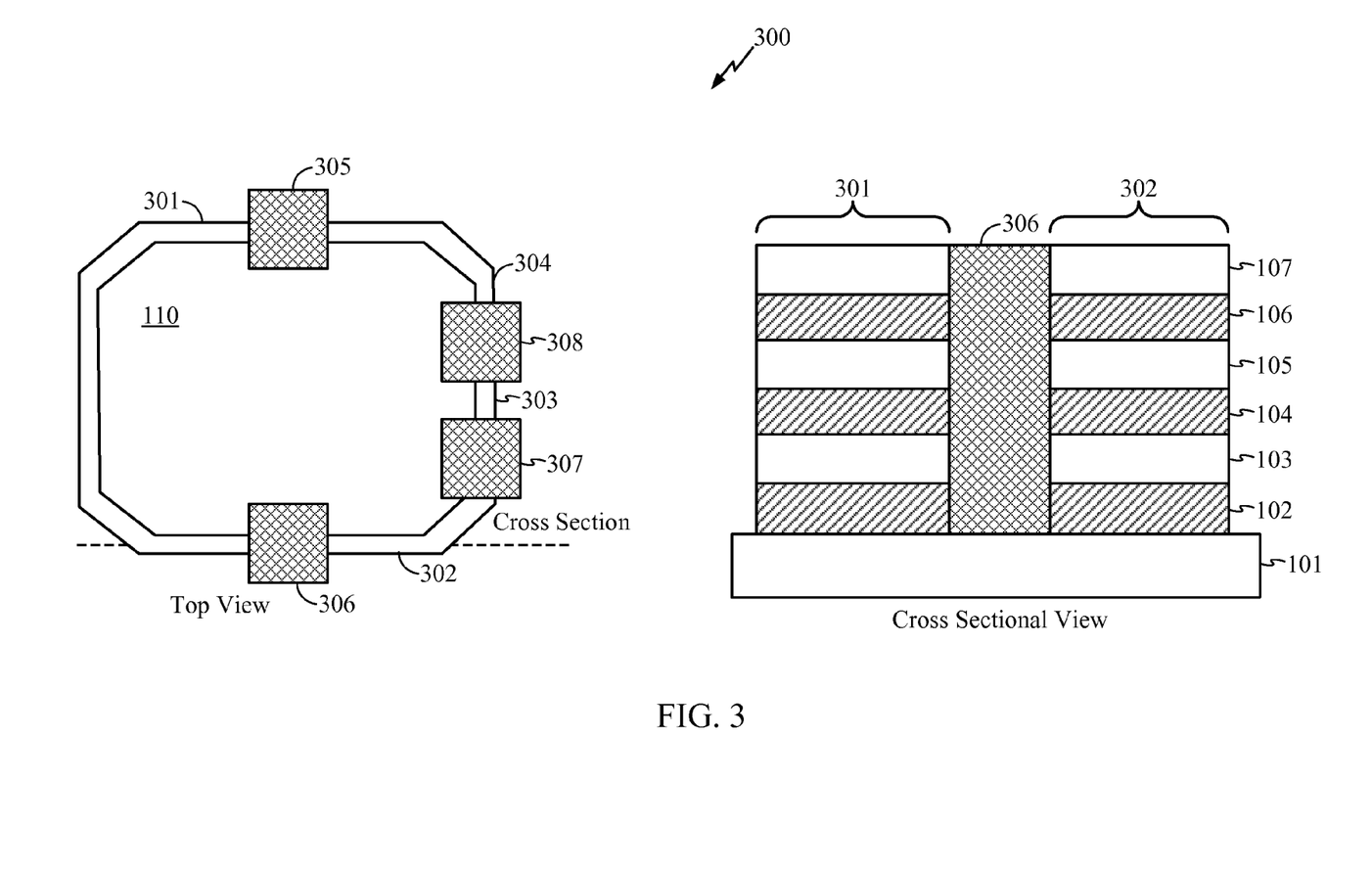
FIG. 3 is an illustration of an exemplary seal ring adapted according to one embodiment of the disclosure.

FIG. 3 is an illustration of an exemplary seal ring 300 adapted according to one embodiment of the disclosure. The seal ring 300 is mechanically continuous but electrically discontinuous. Specifically, the seal ring 300 includes discontinuous conductive segments 301-304, and between the conductive segments is an electrically insulating barrier constituted by insulative segments 305-308. The electrically discontinuous property of the seal ring 300 reduces the propagation of noise around the seal ring 300, thereby ameliorating the noise phenomenon described above with respect to FIG. 1.

Figure 4A:
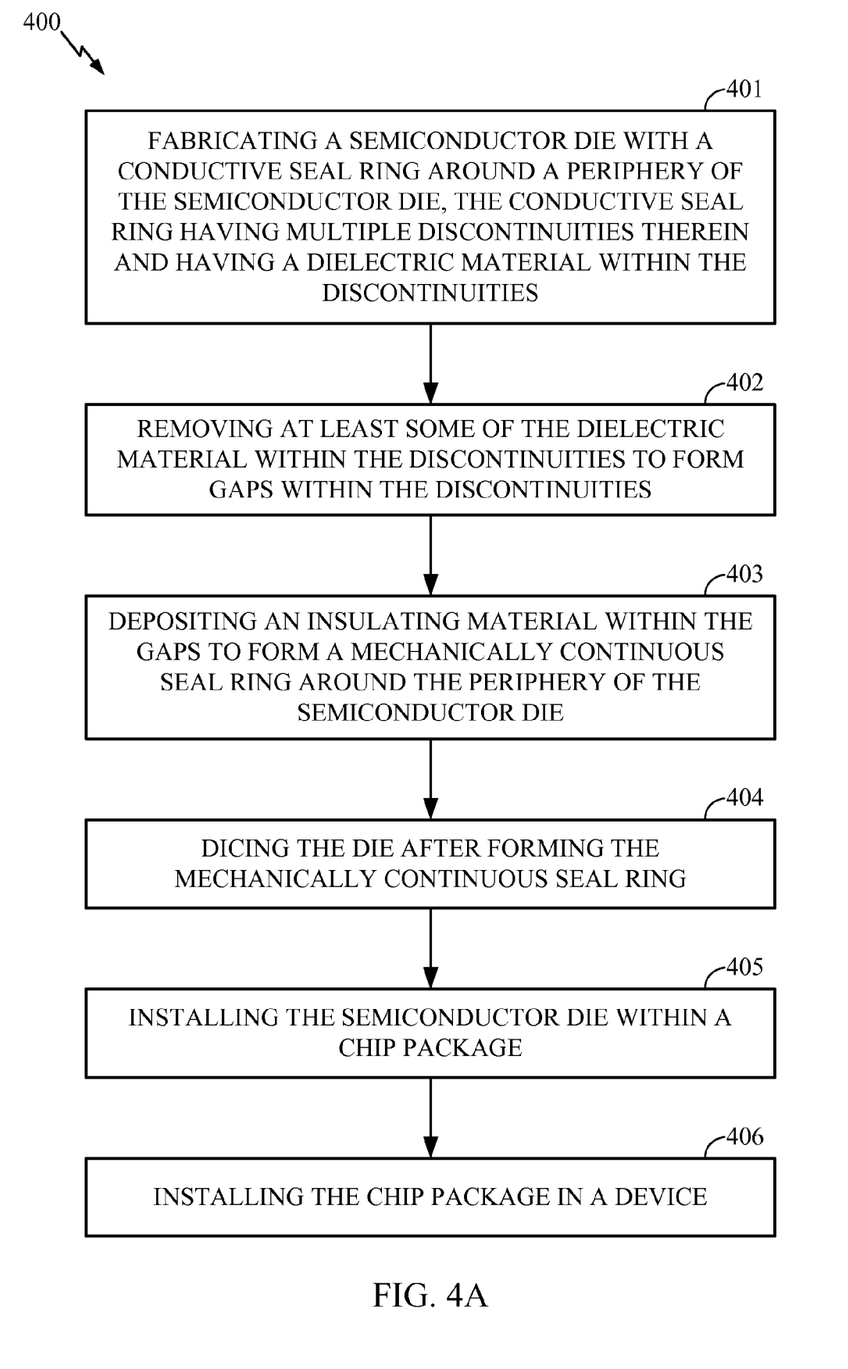
FIG. 4A is an illustration of the exemplary process, adapted according to one embodiment of the disclosure.

In this example, the electrically insulating barrier is also substantially impervious to moisture. That is, the electrically insulating barrier protects against moisture in conditions that can reasonably be expected to be encountered in normal use of the semiconductor die 110. Additionally, the electrically insulating barrier is also substantially impervious to a variety of contaminants, such as sodium ions. Insulative segments 305-308 may include any of a variety of materials, such as silicon nitride, silicon carbide, silicon oxynitride, silicon oxycarbide, polyimide, and the like. The configuration of the conductive segments 301-304 and the insulative barrier FIG. 4A is an illustration of an exemplary process 400, adapted according to one embodiment of the disclosure. The process 400 can be performed, for example, during fabrication of a semiconductor die, as well as during fabrication of a chip package and installation of the chip package.

Figure 4B:
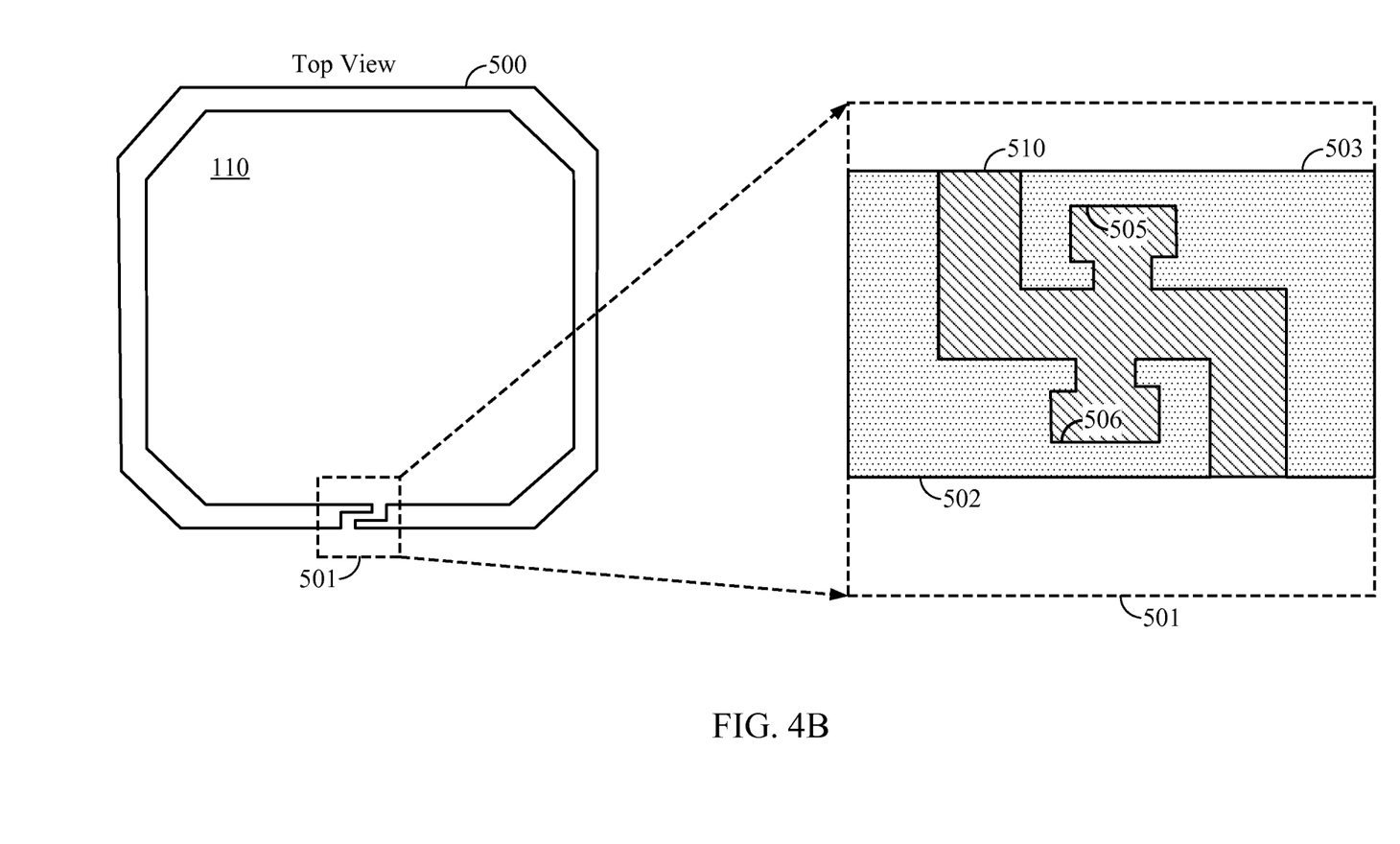
FIG. 4B is a top view illustration of an exemplary seal ring during the action of block 401 of FIG. 4A, adapted according to one embodiment of the disclosure.

In block 401, a semiconductor die is fabricated with a conductive seal ring around a periphery of the semiconductor die, the conductive seal ring having multiple discontinuities therein and having a dielectric material within the discontinuities. The semiconductor die and conductive seal ring can be fabricated using conventional die-fabrication methods or methods later developed. The conductive seal ring, in one example, includes multiple metal layers and vias, though embodiments may include any of a variety of structures in the conductive seal ring. Examples of metals that may be used in the conductive seal ring include aluminum, copper, tungsten, and the like. Examples of dielectric material include Silicon Dioxide, Fluorinated Silicate glass, and the like. An example of the action in block 401 is shown in FIG. 4B.

Figure 4C:
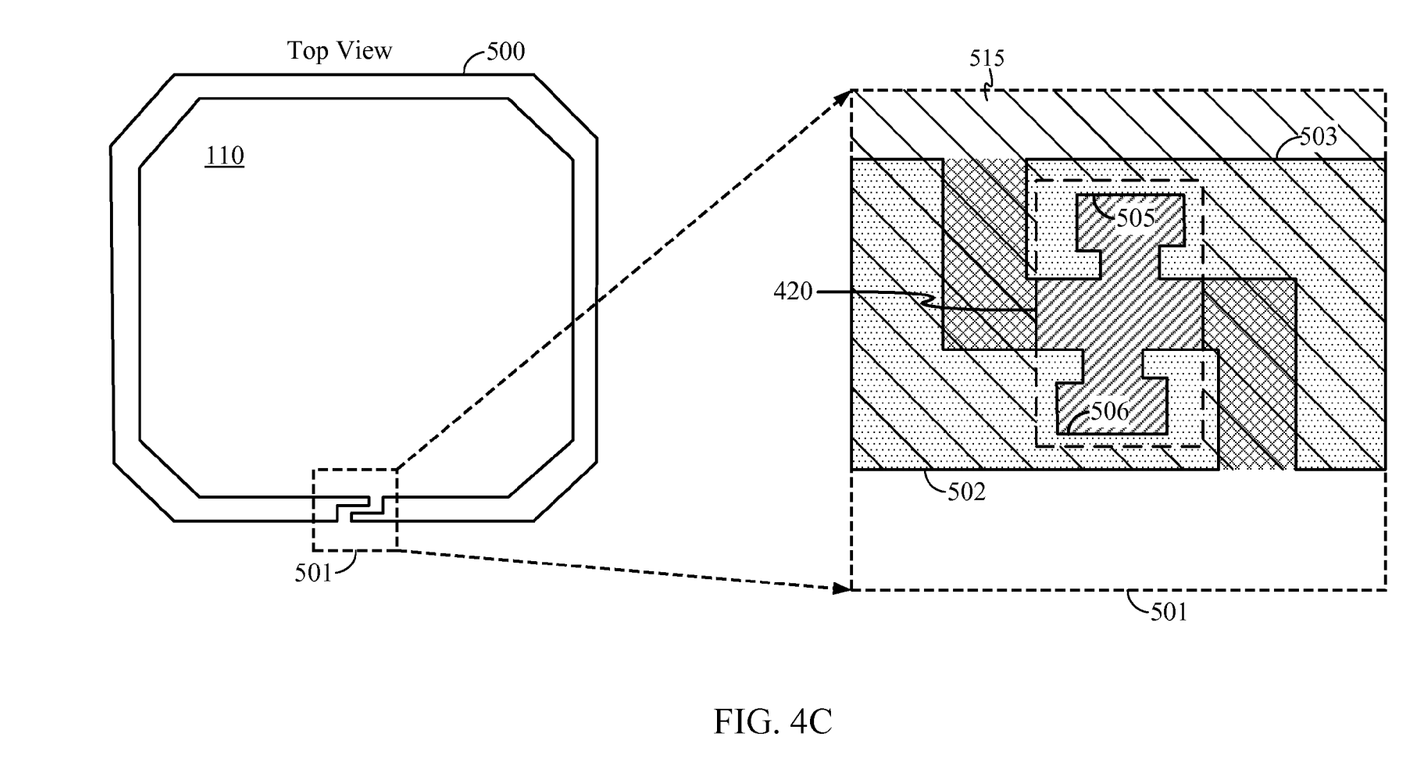
FIG. 4C is a top view illustration of an exemplary seal ring during the action of block 402 of FIG. 4A, adapted according to one embodiment of the disclosure.
Figure 4D:
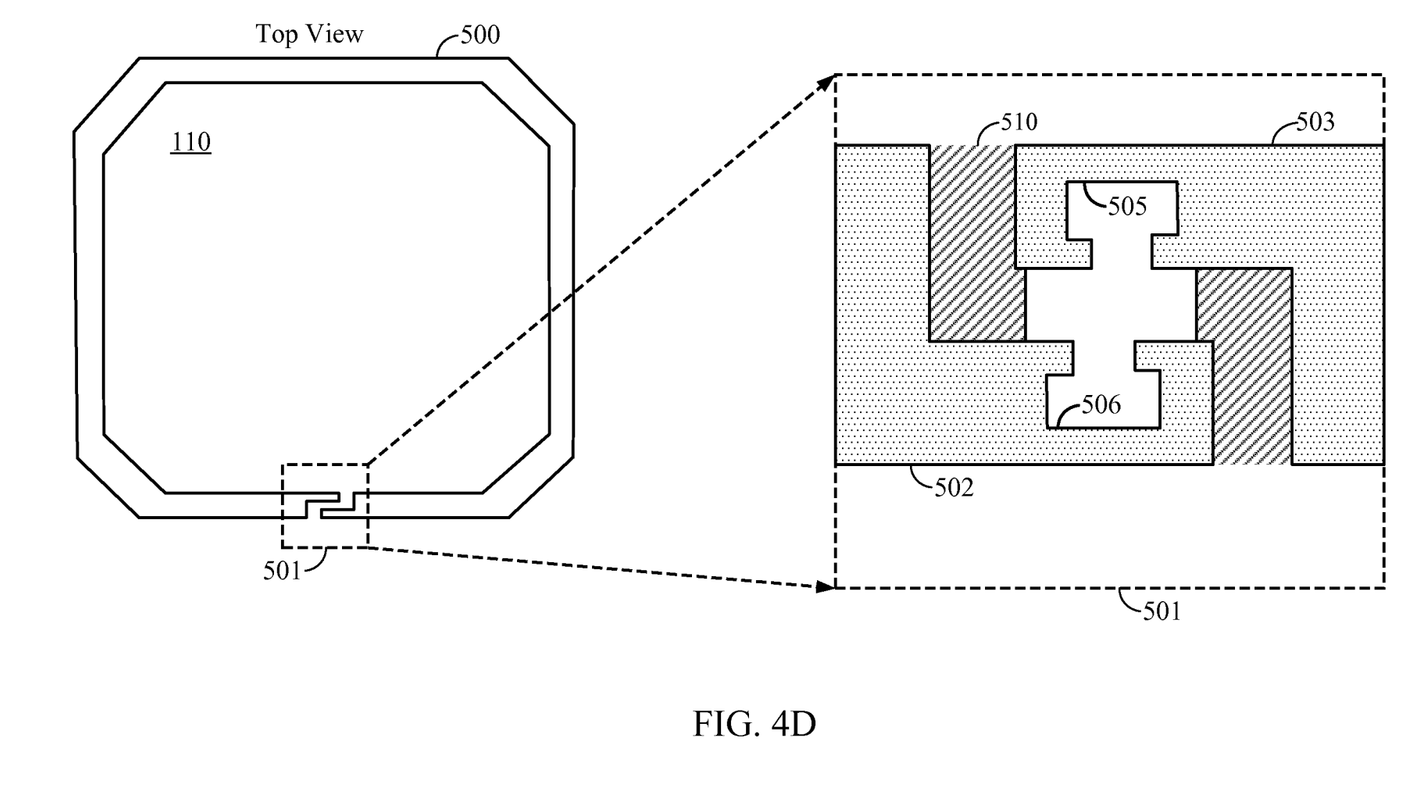
FIG. 4D is a top view illustration of an exemplary seal ring during the action of block 402 of FIG. 4A, adapted according to one embodiment of the disclosure.

In block 402, at least some of the dielectric material within the discontinuities is removed to form gaps within the discontinuities. For instance, some embodiments include disposing a mask on the die that exposes areas of the dielectric material and etching the exposed areas of the dielectric material. An example of the action in block 402 is shown in FIGS. 4C and D.

Figure 4E:
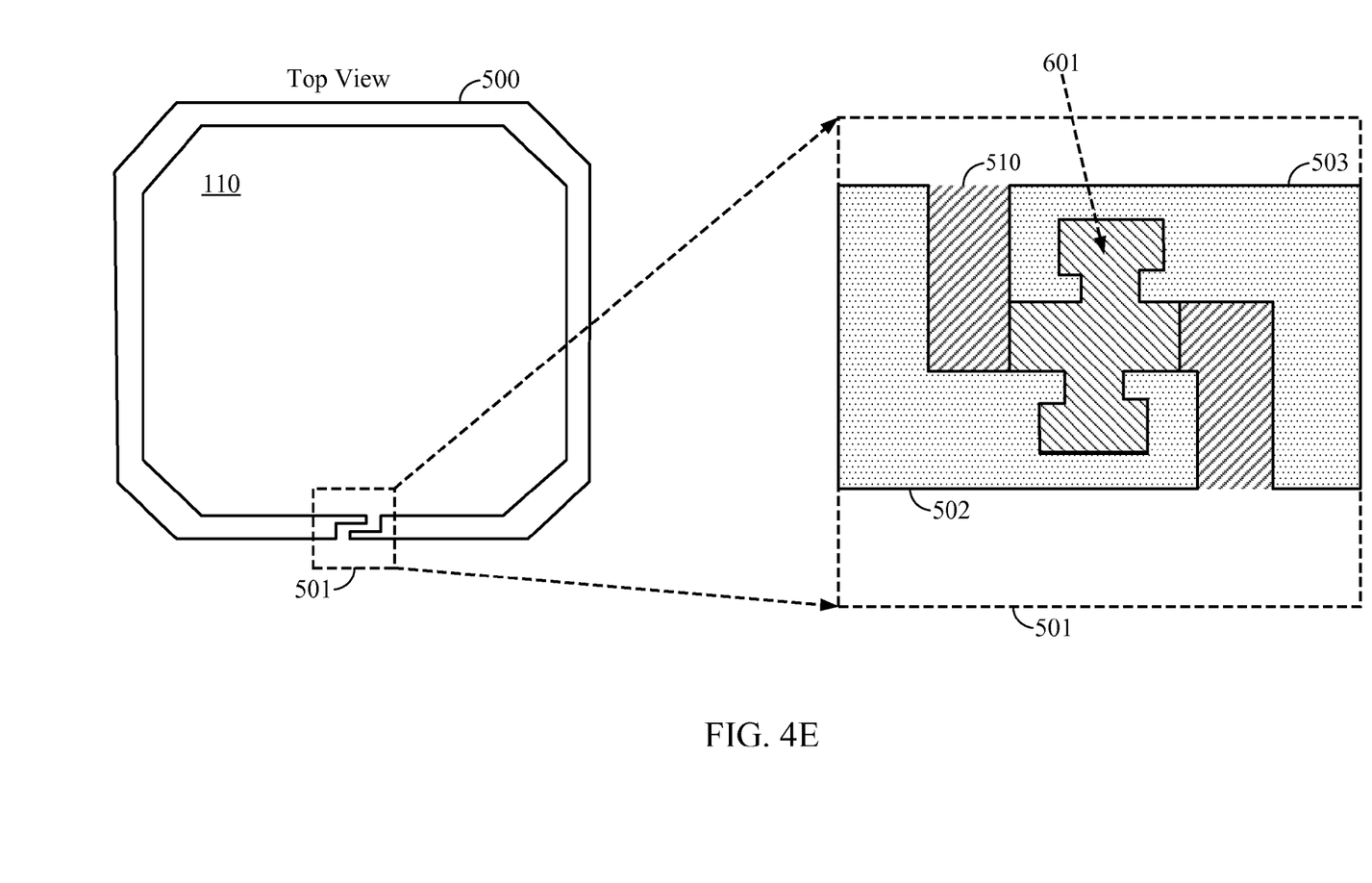
FIG. 4E is a top view illustration of an exemplary seal ring during the action of block 403 of FIG. 4A, adapted according to one embodiment of the disclosure.

In block 403, an insulting material is deposited within the gaps to form a mechanically continuous seal ring around the periphery of the semiconductor die. For instance, one or more deposition processes may be performed to deposit an insulator, such as silicon nitride, within the gaps. An example of a seal ring is shown in FIG. 3, with insulating material deposited as section 306 between the conductive segments 301 and 302. An example of the action in block 403 is shown in FIG. 4E. In various embodiments, the actions of blocks 401-403 are part of the normal semiconductor manufacturing process, rather than a part of post processing.

In block 404, the die is diced after forming the mechanically continuous seal ring. In this example, the mechanically continuous property of the seal ring operates to stop microscopic cracks from reaching the semiconductor die during the dicing process. Such "crack stop" function is described in more detail below with respect to FIG. 4E.

In block 405, the semiconductor die is installed within a chip package. For instance, the semiconductor die may be stacked with one or more other dies to form a chip package that is then installed in a device, such as a music player, a video player, an entertainment unit, a navigation device, a communications device, a personal digital assistant (PDA), a fixed location data unit, a computer, or the like in block 406. While the process 400 is shown as a series of discrete actions, the scope of embodiments is not so limited. Embodiments may add, omit, rearrange, or modify the actions of the process 400.

FIG. 4B is a top view illustration of an exemplary seal ring 500 during the action of block 401 of FIG. 4A, adapted according to one embodiment of the disclosure. FIG. 4B shows a more detailed view of an exemplary discontinuity 501. The discontinuity 501, rather than being a simple gap, has a configuration wherein the end 502 and the end 503 overlap laterally so that there is no straight line path from the inside of the semiconductor die 110 to the outside of the semiconductor die 110 through the discontinuity 501. The discontinuity 501 may also include tie-hold shaped gaps 505 and 506.

In one example process, the semiconductor die 110 is fabricated, as in block 401 of FIG. 4A, with the seal ring 500 having the discontinuity 501. A dielectric material 510 occupies the space between the ends 502, 503.

FIG. 4C is a top view illustration of the exemplary seal ring 500 during the action of block 402 of FIG. 4A, adapted according to one embodiment of the disclosure. Specifically, in FIG. 4C, a mask 515 is applied leaving the space 420 exposed.

FIG. 4D is a top view illustration of the exemplary seal ring 500 during the action of block 402 of FIG. 4A, adapted according to one embodiment of the disclosure. Etching is performed to remove at least some of the dielectric material 510 in the space 420. In one example, the dielectric material 510 is etched with Reactive Ion Etching (RIE), though the scope of embodiments is not limited to any particular etching process. Conventional dielectric removal processes, such as etching, usually are not used to remove metal material (e.g., the material for the metal layers and the vias of FIG. 3). Thus, in this example, the shape shown for the ends 502, 503 is patterned during fabrication of the semiconductor die 110, such that the tie hold-shaped gaps 505, 506 of the discontinuity 501 are revealed as the dielectric material 510 is removed. After the etching is performed, the mask 415 may be removed.

FIG. 4E is a top view illustration of the exemplary seal ring 500 during the action of block 403 of FIG. 4A, adapted according to one embodiment of the disclosure. Continuing with the example process, deposition is then performed to create a plug 601 of insulative material, thereby creating a barrier in the discontinuity 501 to moisture and other contaminants. In one example, the plug 601 is deposited with Chemical Vapor Deposition (CVD). The scope of embodiments is not limited to CVD, as other processes may be used, such as sputter deposition, low pressure CVD, atmospheric CVD, and plasma enhanced CVD. Of note in the example embodiment of FIG. 4E is the interlocking configuration of the ends 502, 503 with the tie hold shape of the plug 601. The design of the discontinuity 501 and the plug 601 provides mechanical stability, helping to ensure that the ends 502, 503 are not physically forced apart or separated from the plug 601.

The interlocking configuration of the ends 502, 503 with the plug 601 is also noteworthy in this example in its ability to stop cracks in the dicing process. As mentioned above, there is no straight line access from the inside of the semiconductor die 110 to the outside of the semiconductor die 110 through the discontinuity 501. Such configuration helps to reduce the chance that a crack may penetrate the inside of the semiconductor die 110.

While FIGS. 3 through 4E show two example designs for discontinuities and insulative barriers, the scope of embodiments is not so limited. For example, the shape of a given discontinuity may differ from those shown in FIGS. 3 through 4E. Additionally, the number of discontinuities for a given die may be chosen for any of a variety of reasons, including the characteristics of the die. For instance, discontinuities are usually placed at portions of a seal ring that correspond to boundaries of the functional blocks within the die, and the number of blocks and types of blocks in a die may guide an engineer in choosing the placement and number of discontinuities. Furthermore, while the examples above show a single seal ring for a given die, other embodiments may have more than one seal ring for a die.

Various embodiments provide one or more advantages over conventional technologies. For instance, some conventional designs use electrically and physically discontinuous seal rings that are susceptible to moisture and contamination. By contrast, various embodiments of the disclosure provide seal rings that are substantially impervious to moisture and contamination and reduce transfer of interference between functional blocks in the die.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor die, comprising:
   a plurality of discontinuous conductive segments arranged around a periphery of the semiconductor die; and
   an electrically insulating barrier and at least one adjacent dielectric located side by side within discontinuities between the conductive segments, the at least one dielectric portion and the electrically insulating barrier forming a mechanically continuous seal ring around the semiconductor die.

2. The semiconductor die of claim 1 in which the electrically insulating barrier interlocks with adjacent conductive segments.

3. The semiconductor die of claim 1 in which the mechanically continuous seal ring is substantially impervious to moisture.

4. The semiconductor die of claim 1 in which the discontinuous conductive segments comprise at least one metal layer and at least one via.

5. The semiconductor die of claim 1 in which the electrically insulating barrier comprises at least one of: silicon nitride, silicon carbide, silicon oxynitride, silicon oxycarbide, and polyimide.

6. The semiconductor die of claim 1 in which the semiconductor die comprises at least one digital logic block and at least one analog block.

7. The semiconductor die of claim 1 installed in a music player, a video player, an entertainment unit, a navigation device, a communications device, a personal digital assistant (RDA), a fixed location data unit, and/or a computer.

8. A method for fabricating a semiconductor die, the method comprising:
    providing a semiconductor die having a periphery;
    providing a discontinuous conductive seal ring around the periphery of the semiconductor die;
    providing a dielectric material within discontinuities of the conductive seal ring;
    removing at least some of the dielectric material within the discontinuities to form gaps within the discontinuities; and
    depositing an insulating material within the gaps to form a mechanically continuous seal ring around the periphery of the semiconductor die, the insulating material and at least one adjacent dielectric material portion being formed side by side within the discontinuities.

9. The method of claim 8 in which removing at least some of the dielectric material comprises:
    applying a mask to expose areas along the conductive seal ring; and
    etching the at least some of the dielectric material in the exposed areas.

10. The method of claim 8 further comprising:
    dicing the semiconductor die after forming the mechanically continuous seal ring.

11. The method of claim 8 further comprising:
    installing the semiconductor die within a chip package.

12. The method of claim 11 further comprising:
    installing the chip package in a music player, a video player, an entertainment unit, a navigation device, a communications device, a personal digital assistant (PDA), a fixed location data unit, and/or a computer.

13. The method of claim 8 in which depositing the insulating material comprises:
    depositing the insulating material within tie-hold-shaped recesses of the respective discontinuities.

14. A semiconductor die, comprising:
    first means for sealing a periphery of the semiconductor die, the first sealing means being discontinuous and conductive; and
    second means for sealing the periphery of the semiconductor die, the second sealing means being insulative and located side by side with at least one dielectric portion within the discontinuities of the first sealing means, the at least one dielectric portion, the first and second sealing means forming a mechanically continuous seal ring around the semiconductor die.

15. The semiconductor die of claim 14 in which the second sealing means interlocks with the first sealing means.

16. The semiconductor die of claim 14 in which the second sealing means comprises a plurality of plugs that seal the discontinuities.

17. The semiconductor die of claim 14 in which the mechanically continuous seal ring is substantially impervious to moisture.

18. The semiconductor die of claim 14 in which the first sealing means comprise at least one metal layer and at least one via.

19. The semiconductor die of claim 14 in which the second sealing means comprises at least one of: silicon nitride, silicon carbide, silicon oxynitride, silicon oxycarbide, and polyimide.

20. The semiconductor die of claim 14 in which the semiconductor die comprises at least one digital logic block and at least one analog block.

21. The semiconductor die of claim 14 installed in a music player, a video player, an entertainment unit, a navigation device, a communications device, a personal digital assistant (PDA), a fixed location data unit, and/or a computer.

* * * * *